United States Patent
Derrig

(10) Patent No.: US 9,034,488 B2
(45) Date of Patent: May 19, 2015

(54) COATED METALLIC PRODUCTS AND METHODS FOR MAKING THE SAME

(71) Applicant: Frederick Goldman, Inc., New York, NY (US)

(72) Inventor: Andrew Derrig, Lynbrook, NY (US)

(73) Assignee: Frederick Goldman, Inc., New York, NY (US)

( * ) Notice: Subject to any disclaimer, the term of this patent is extended or adjusted under 35 U.S.C. 154(b) by 0 days.

(21) Appl. No.: 14/165,409

(22) Filed: Jan. 27, 2014

(65) Prior Publication Data

US 2014/0141277 A1 May 22, 2014

Related U.S. Application Data

(63) Continuation of application No. 13/486,356, filed on Jun. 1, 2012.

(60) Provisional application No. 61/493,283, filed on Jun. 3, 2011.

(51) Int. Cl.
| | |
|---|---|
| *A44C 9/00* | (2006.01) |
| *A44C 27/00* | (2006.01) |
| *C23C 14/00* | (2006.01) |
| *C23C 16/00* | (2006.01) |

(52) U.S. Cl.
CPC ............ *A44C 27/006* (2013.01); *A44C 9/00* (2013.01); *C23C 14/00* (2013.01); *C23C 16/00* (2013.01)

(58) Field of Classification Search
CPC .............. A44C 5/00; A44C 7/00; A44C 9/00; A44C 27/005; A44C 27/006; A44C 27/007; C23C 30/005

USPC ......... 63/3, 12, 15, 15.9, 20, 23, 34; 428/469, 428/472, 697, 698, 699, 704

See application file for complete search history.

(56) References Cited

U.S. PATENT DOCUMENTS

| | | | |
|---|---|---|---|
| 3,719,479 A | | 3/1973 | Flanagan |
| 3,958,070 A | * | 5/1976 | Schintlmeister et al. ..... 428/457 |
| 4,101,318 A | | 7/1978 | Rudy |
| 4,374,900 A | | 2/1983 | Hara et al. |
| 4,403,014 A | * | 9/1983 | Bergmann ........................ 63/12 |
| 4,505,746 A | | 3/1985 | Nakai et al. |
| 4,557,981 A | | 12/1985 | Bergmann |
| 4,636,252 A | | 1/1987 | Yoshimura et al. |
| 4,745,035 A | * | 5/1988 | Saurer et al. .................. 428/614 |
| 4,898,768 A | * | 2/1990 | Randhawa ..................... 428/699 |

(Continued)

FOREIGN PATENT DOCUMENTS

| | | | |
|---|---|---|---|
| DE | 202006017385 | * | 1/2007 |
| EP | 1318204 | | 6/2003 |

(Continued)

OTHER PUBLICATIONS

International Search Report and Written Opinion dated Aug. 21, 2012 in related International Application No. PCT/US2012/040415 filed Jun. 1, 2012, 7 pages.

(Continued)

*Primary Examiner* — Archene Turner
(74) *Attorney, Agent, or Firm* — Dentons US LLP

(57) ABSTRACT

The present invention relates generally to jewelry articles comprising a substrate and a metallic, external coating.

22 Claims, 3 Drawing Sheets

(56) References Cited

U.S. PATENT DOCUMENTS

| | | | |
|---|---|---|---|
| 4,943,486 A * | 7/1990 | Uchiyama | 428/698 |
| 5,021,208 A | 6/1991 | Ludwig et al. | |
| 5,776,408 A | 7/1998 | Ghosh et al. | |
| 5,853,826 A | 12/1998 | Starcke et al. | |
| 5,985,469 A * | 11/1999 | Kurakata et al. | 428/627 |
| 6,062,045 A | 5/2000 | West | |
| 6,319,460 B1 | 11/2001 | Fang | |
| 6,544,315 B2 | 4/2003 | Har-Shai | |
| 6,553,667 B1 | 4/2003 | West | |
| 6,641,640 B1 | 11/2003 | Hesse et al. | |
| 6,767,418 B1 | 7/2004 | Zang et al. | |
| 6,780,527 B2 * | 8/2004 | Naoi et al. | 428/472 |
| 6,928,734 B1 | 8/2005 | West | |
| 6,990,736 B2 | 1/2006 | West | |
| 6,993,842 B2 | 2/2006 | West | |
| 7,032,314 B2 | 4/2006 | West | |
| 7,076,972 B2 | 7/2006 | West | |
| 7,261,956 B2 * | 8/2007 | Kawakami et al. | 428/704 |
| 7,438,769 B2 * | 10/2008 | Ko et al. | 148/206 |
| 7,761,996 B2 | 7/2010 | West | |
| 8,003,225 B2 * | 8/2011 | Miya et al. | 63/34 |
| 8,061,033 B2 | 11/2011 | West | |
| 8,168,012 B2 | 5/2012 | Steinemann | |
| 2003/0134577 A1 | 7/2003 | Coad | |
| 2005/0166401 A1 | 8/2005 | Robert | |
| 2005/0208325 A1 | 9/2005 | Kawakami et al. | |
| 2006/0051618 A1 | 3/2006 | Festeau et al. | |
| 2007/0056778 A1 | 3/2007 | Webb et al. | |
| 2008/0241551 A1 | 10/2008 | Zhang et al. | |
| 2009/0041612 A1 | 2/2009 | Fang et al. | |
| 2009/0308102 A1 | 12/2009 | Miller | |
| 2010/0047618 A1 | 2/2010 | Rostagno | |
| 2010/0261034 A1 | 10/2010 | Cardarelli | |
| 2010/0329920 A1 | 12/2010 | Rosenberg | |
| 2011/0218093 A1 | 9/2011 | Xia | |
| 2011/0296873 A1 | 12/2011 | Derrig | |
| 2012/0093675 A1 | 4/2012 | Miller | |

FOREIGN PATENT DOCUMENTS

| | | | |
|---|---|---|---|
| GB | 2162864 | * | 2/1986 |
| JP | 58-11783 | * | 1/1983 |
| JP | 08-013133 | * | 1/1996 |

OTHER PUBLICATIONS

International Search Report and Written Opinion dated Aug. 21, 2012 in related International Application No. PCT/US2012/040460 filed Jun. 1, 2012, 10 pages.
International Search Report and Written Opinion dated Aug. 27, 2012 in related International Application No. PCT/US2012/040356 filed Jun. 1, 2012, 14 pages.
EP1318204, English translation by Patent Translate published Jun. 11, 2003, downloaded from European Patent Office on May 30, 2013, no English language corresponding application is available, 6 pages.

* cited by examiner

COATED METALLIC PRODUCTS AND METHODS FOR MAKING THE SAME

CROSS-REFERENCE TO RELATED APPLICATIONS

The present application is a Continuation of U.S. Nonprovisional Application Ser. No. 13/486,356 filed 1 Jun. 2012; which claims the benefit of U.S. Provisional Application Ser. No. 61/493,283 filed 3 Jun. 2011; each of which are incorporated herein by reference in its entirety.

BACKGROUND OF THE INVENTION

The present application generally relates to metal or metallic articles such as jewelry articles or components of jewelry articles that are coated or plated with a metal or metallic coating.

Plating is a process where a thin layer of metal is deposited on the surface of a substrate. Metals are plated for various reasons, including for decoration, to harden, to alter conductivity, to inhibit corrosion, to reduce friction, to improve paint adhesion, to improve solderability, to improve wearability, and for radiation shielding. Gemstones can also be plated to provide improved color characteristics. See, e.g., U.S. Pat. No. 5,853,826.

Processes used in plating include electroplating, physical vapor deposition (PVD) and chemical vapor deposition (CVD). In electroplating, an electrical current is used to reduce cations of a coating material from a solution to coat a conductive substrate with a thin layer of the material. In PVD, a vaporized form of the coating metal is condensed in a vacuum onto the substrate surface. Vaporization and deposition of the coating metal can be effected by a number of methods known in the art, including evaporative deposition, electron beam physical vapor deposition, sputter deposition, cathodic arc deposition, pulsed laser deposition, and plasma-spray deposition. CVD involves exposing the substrate to a volatile precursor of the coating metal, which reacts or decomposes on the substrate surface.

While electroplating is the simplest process of plating a metal, electroplating is difficult or impossible where the substrate is a refractory metal such as tungsten, molybdenum, niobium, tantalum or rhenium. In particular tungsten and tungsten alloys such as tungsten carbide cannot be electroplated. Thus, a tungsten or tungsten alloy article such as an article of jewelry cannot be directly electroplated with, e.g., a layer of a precious metal such as gold, platinum or rhodium. This makes production of plated articles of a tungsten or tungsten alloy substrate difficult to produce. There is thus a need for new methods of making such articles. The present invention addresses that need.

SUMMARY

In some embodiments, the present disclosure relates to a method for producing a coated jewelry article or a coated component of a jewelry article, comprising: providing a jewelry article or a component of a jewelry article; and subjecting the jewelry article or the component of a jewelry article to a layering process to obtain a coated jewelry article or component of a jewelry article comprising a coating, wherein the jewelry article or component of a jewelry article and the coating form a surface that is resistant to deformation and wear and substantially retains the color of the coating material. In further embodiments, the first coated jewelry article or component of the jewelry article comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, zinc, tin, German silver, niobium, molybdenum, rhenium, hafnium, alloys of each of the foregoing and any combinations thereof. In still further embodiments, the coated jewelry article or component of the jewelry article comprises tungsten carbide. In additional embodiments, the coating comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, zinc, tin, German silver, niobium, molybdenum, rhenium, hafnium, alloys of each of the foregoing and any combinations thereof.

In some embodiments, the coating comprises cobalt-chromium. In further embodiments, the jewelry article or component of the jewelry article is a ring, ornamental ring, engagement ring, toe ring, watch, bracelet, necklace, pendant, charm, armlet, brocade, pin, clip, hairclip, fob, ornamental piercing, earring, nose ring, dog tag, amulet, bangle bracelet, cuff bracelet, link bracelet, cuff link, key chain, money clip, cell phone charm, signet ring, class ring, friendship ring or purity ring or a component any of the foregoing. In still further embodiments, the coating comprises at least one of titanium nitride (TiN), titanium(2) nitride (Ti$_2$N), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), titanium-zirconium (TiZi), titanium-niobium-zirconium (TiNiZi), tungsten nitride (WN), titanium diboride (TiB$_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and alloys of each of the foregoing and any combinations thereof. In additional embodiments, the coating comprises at least one of cobalt-chromium, cobalt, stainless steel, nickel, chromium and zirconium. In some embodiments, the coating is selected from the group consisting of a metal, a metal compound, a material having metallic properties, a metallic compound, a metal alloy, a metal carbide, a metal nitride and a metal boride.

In some embodiments, the coating exhibits electrical conductivity. In further embodiments, the coating is deposited onto the substrate using electroplating, physical vapor deposition (PVD) or chemical vapor deposition (CVD). In still further embodiments, the coating alters the luster of the jewelry article. In additional embodiments, the luster is selected from color change, adamantine, dull, greasy, metallic, pearly, resinous, silky, submetallic, vitreous, waxy, asterism, aventurescence, chatoyancy, and schiller. In additional embodiments, the jewelry article or component of the jewelry article is capable of being manipulated prior to the layering process. In some embodiments, the manipulation is performed using at least one of a CNC machine, a laser, photo lithography, a water jet, a lathe, a tumbler, a drill, a saw, a file, power tools and hand tools.

In some embodiments, the present invention relates to a jewelry article or component of a jewelry article having a metal or metallic coating, comprising: a jewelry article or a component of a jewelry article; and a coating comprising a metal, a metal compound, a material having metallic properties or a compound having metallic properties, wherein the coating is coupled to the jewelry article or component of the jewelry article, and wherein the jewelry article or component of the jewelry article and the coating form a surface that is resistant to deformation and wear and substantially retains the color of the coating material. In further embodiments, the jewelry article or component of the jewelry article comprises at least one of titanium nitride (TiN), titanium(2) nitride ($Ti_2N$), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), titanium-zirconium (TiZi), titanium-niobium-zirconium (TiNiZi), tungsten nitride (WN), titanium diboride ($TiB_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and alloys of each of the foregoing and any combinations thereof.

In some embodiments, the coated jewelry article or component of the jewelry article comprises tungsten carbide. In further embodiments, the coating exhibits electrical conductivity. In still further embodiments, the coating is deposited onto the jewelry article or component of the jewelry article using electroplating, physical vapor deposition (PVD) or chemical vapor deposition (CVD). In additional embodiments, the coating comprises at least one of titanium nitride (TiN), titanium(2) nitride ($Ti_2N$), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), titanium-zirconium (TiZi), titanium-niobium-zirconium (TiNiZi), tungsten nitride (WN), titanium diboride ($TiB_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and alloys of each of the foregoing and any combinations thereof. In some embodiments, the coating comprises cobalt-chromium. In additional embodiments, the coating alters the luster of the metallic substance. In some embodiments, the luster is selected from color change, adamantine, dull, greasy, metallic, pearly, resinous, silky, submetallic, vitreous, waxy, asterism, aventurescence, chatoyancy, and schiller.

In some embodiments, the coating is selected from the group consisting of a metal, a metal alloy, a material having metallic properties, a metallic compound, a metal carbide, a metal nitride and a metal boride. In further embodiments, the jewelry article or component of the jewelry article is a ring, ornamental ring, engagement ring, toe ring, watch, bracelet, necklace, pendant, charm, armlet, brocade, pin, clip, hairclip, fob, ornamental piercing, earring, nose ring, dog tag, amulet, bangle bracelet, cuff bracelet, link bracelet, cuff link, key chain, money clip, cell phone charm, signet ring, class ring, friendship ring or purity ring or a component any of the foregoing. In still further embodiments, the coating comprises at least one of titanium nitride (TiN), titanium(2) nitride ($Ti_2N$), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), titanium-zirconium (TiZi), titanium-niobium-zirconium (TiNiZi), tungsten nitride (WN), titanium diboride ($TiB_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and alloys of each of the foregoing and any combinations thereof. In additional embodiments, the coating comprises at least one of cobalt-chromium, cobalt, stainless steel, nickel, chromium and zirconium.

DETAILED DESCRIPTION

Figure 1:
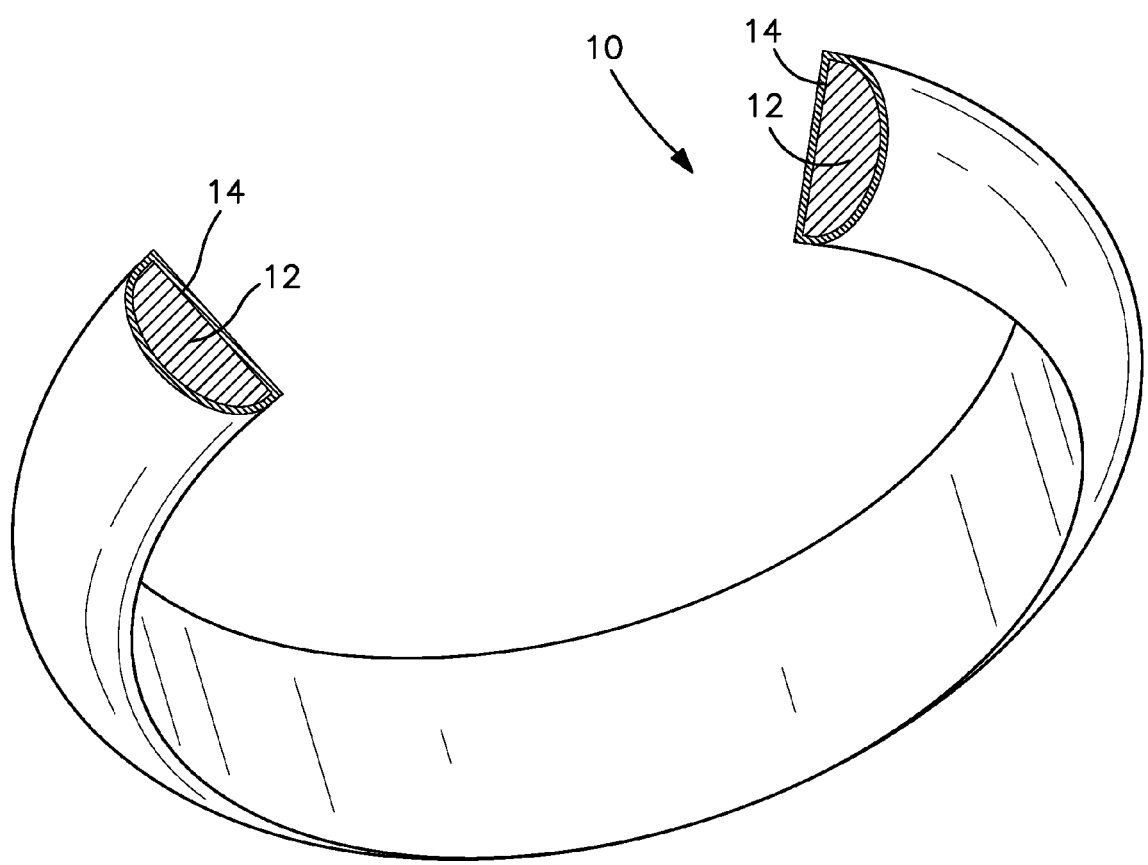
FIG. 1 shows a ring in accordance with an illustrative embodiment with a transverse cross-sectional cutout.

Described herein are articles having metallic coatings. Particularly suitable external metallic coatings for these rings are any material that can be electroplated or vapor deposited onto the first coating. In some embodiments, the external metallic coating comprises a material that imparts an attractive coloration to the ring, for example platinum, rhodium, palladium, ruthenium, gold, a gold alloy, silver, a silver alloy, zirconium, tungsten nitride, tungsten carbide, or chrome. In particular embodiments, the external metallic coating modifies the luster of the article.

For example, one specific embodiment of a ring comprises a tungsten carbide substrate and a cobalt or cobalt-chromium coating.

The external metallic coating can be any coating appropriate for the metallic article. Where a hard surface is desired, for example for an article that is subject to extensive wear, such as a belt buckle, a picture frame, a paperweight, or a portion of a piece of furniture (e.g., an inlay) that may be abraded during use, the external metallic coating can be a hard material such as TiAlN, TiN, or $TiB_2$. In other embodiments, the external metallic coating comprises a material that enhances the luster and/or imparts an attractive coloration to the article, including but not limited to platinum, rhodium, palladium, ruthenium, gold, silver, zirconium, tungsten nitride, tungsten carbide, chrome and/or alloys thereof.

Definitions

In the description herein, a number of terms are used. In order to provide a clear and consistent understanding of the specification and claims, the following definitions are provided:

As used herein, the singular forms "a", "an" and "the" are intended to include the plural forms as well, unless the context clearly indicates otherwise. Additionally, the use of "or" is intended to include "and/or", unless the context clearly indicates otherwise.

Electroplating: Refers to the process of moving metal ions in solution via an electrical or conductive field to coat an object. This process is used for the deposition of a material, such as a metal or metal alloy, for imparting a desirable property onto the object, including but not limited to resistance to scratching, corrosivity, chipping and dulling.

Jewelry: As used herein, "jewelry" refers to personal adornments worn for ornament or utility. Jewelry includes but is in no way limited to rings, ornamental rings, engagement rings, toe rings, watches, watchcases, bracelets, necklaces, chains, pendants, charms, armlets, brocades, pins, clips, hairclips, carved beads, fobs, ornamental piercings, earrings, nose rings, body jewelry, dog tags, amulets, bangle bracelets, cuff bracelets, link bracelets, cuff links, tie clips, tie pins, tie tacks, key chains, money clips, cell phone charms, cutlerys, writing utensils, pens, charms, signet rings, class rings, friendship rings or purity rings.

Layering: As used herein, "layering" refers to a process wherein a composition, advantageously a metallic composition, is applied to a substrate optionally comprising zero, one, or more layered composition(s). In some embodiments, layering is performed using a machine or instrument capable of performing a vapor deposition or electroplating process.

Luster: As used herein, "luster" refers to the way light interacts with the surface and visual appearance of a substance. In some embodiments, the substance is a jewelry article. In further embodiments, the substance is a metallic substance that is optionally capable of being manipulated.

Manipulable: As used herein, a substance that is "manipulable" is one capable of being patterned, surface modulated, etched, carved, faceted, cut, pressed, molded, cast, stricken, extruded, inlayed, shaped, polished, grinded, scraped, rubbed, sanded, buffed and/or filed. In preferred embodiments, the substance is a substrate for use in the present disclosure.

Metal Alloy: As used herein, a "metal alloy" is a mixture of two or more metals or of substances with metallic properties. In some embodiments, metal alloys for use in the present disclosure comprise at least one transition metal including but in no way limited to tungsten, cobalt, tungsten, titanium, zirconium, tantalum, aluminum, rhodium, gold, silver, platinum, palladium, iridium, iron, stainless steel, nickel, niobium, vanadium, ruthenium, copper, zinc, tin, molybdenum, hafnium and rhenium. In certain embodiments, the metal alloy is selected from a gold alloy, silver alloy, platinum alloy, palladium alloy and iron alloy. In further embodiments, a stainless steel alloy is selected from types 18-8, 304 and 316.

Metal Carbide: A "metal carbide" is a compound comprising at least one transition metal or substance with metallic properties and carbon or carbon containing chemical group. In certain embodiments, metal carbides for use in the present disclosure include but are in no way limited to tungsten carbide, tungsten-copper carbide, tungsten-silver-copper carbide, titanium carbide, zirconium carbide, niobium carbide, hafnium carbide, vanadium carbide, tantalum carbide, chromium carbide, aluminum carbide and molybdenum carbide.

Metal Nitride: A "metal nitride" is a compound comprising at least one transition metal or substance with metallic properties and nitrogen or nitrogen containing chemical group. In some embodiments, metal nitrides for use in the present disclosure include but are in no way limited to titanium nitride, chromium nitride, zirconium nitride, tungsten nitride, gold nitride, silver nitride, aluminum nitride, vanadium nitride, tantalum nitride, aluminum-titanium-nitride, titanium-aluminum-nitride and titanium-carbon-nitride.

Metal Salt: A "metal salt" is a compound comprising at least one cationic, transition metal or cation with metallic properties and an anion. In some embodiments, metal salts for use in the present disclosure comprise at least one transition metal including but in no way limited to tungsten, cobalt, titanium, zirconium, tantalum, aluminum, rhodium, gold, silver, platinum, palladium, iridium, iron, stainless steel, cobalt, chromium, aluminum, vanadium, ruthenium, copper, zinc, tin, nickel, niobium, molybdenum, rhenium and hafnium.

Metal Sulfide: A "metal sulfide" is a compound comprising at least one transition metal or substance with metallic properties and sulfur or sulfur containing chemical group.

Polishing: As used herein, "polishing" refers to the process of smoothing and/or increasing the luster of a surface by the application of physical or chemical action or agent to a substance.

Vapor Deposition: Refers to a general process for the deposition of compounds onto a designated substrate. In preferred embodiments, the use of vapor deposition in the context of the present disclosure refers to chemical vapor deposition (CVD), physical vapor deposition (PVD), plasma enhanced chemical vapor deposition (PECVD), diamond CVD coating, ionized physical vapor deposition (IPVD), sputtering and thermal evaporation. In certain embodiments, vapor deposition is optionally used to add a first layer to a substrate used to produce a jewelry article. In preferred embodiments, the first layer comprises a metal coating comprising one or more of tungsten, cobalt, tungsten, titanium, zirconium, tantalum, aluminum, rhodium, gold, silver, platinum, palladium, iridium, iron, stainless steel, nickel, niobium, vanadium, ruthenium, copper, zinc, tin, hafnium, molybdenum and rhenium. In certain embodiments, the metal alloy is selected from a gold alloy, silver alloy, platinum alloy, palladium alloy and iron alloy. In further embodiments, a stainless steel alloy is selected from types 18-8, 304 and 316.

Figure 2:
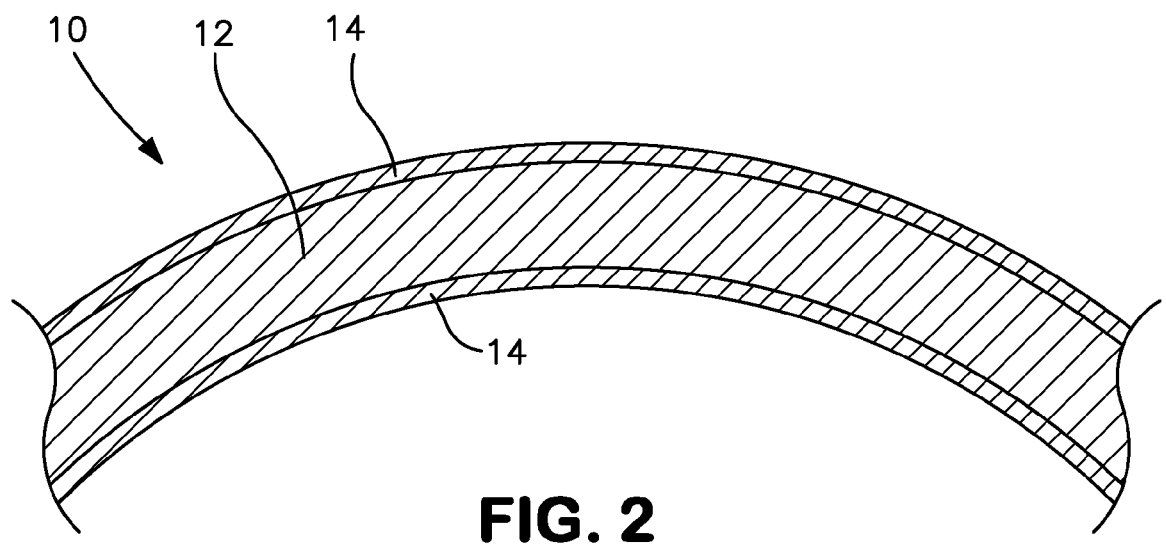
FIG. 2 is a longitudinal cross-section of a ring in accordance with an illustrative embodiment.
Figure 3:
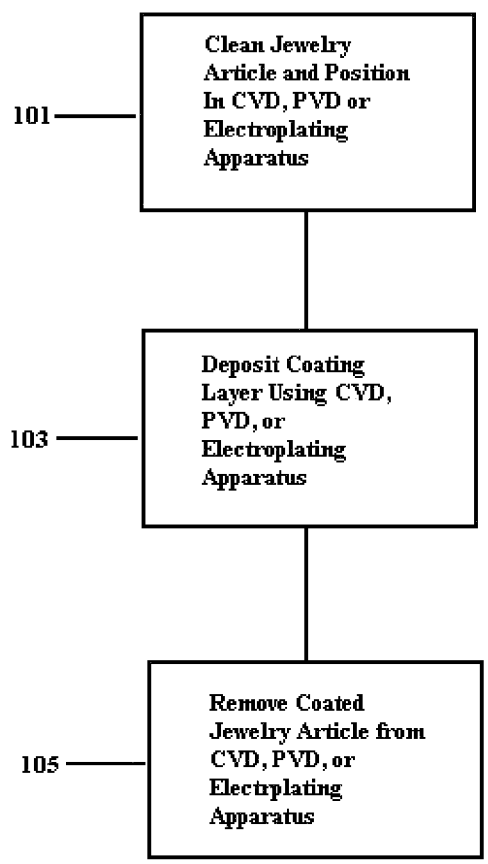
FIG. 3 shows a schematic for producing a coated jewelry article in accordance with an illustrative embodiment.

FIGS. 1 and 2 provide a transverse cutout (FIG. 1) and a longitudinal cross-section (FIG. 2) of a finger ring 10 in accordance with some embodiments. In these embodiments, the substrate 12 is coated with a coating 14. In the figures, the thicknesses of the coating 14 is not necessarily drawn to scale.

Other embodiments within the scope of the claims herein will be apparent to one skilled in the art from consideration of the specification or practice of the invention as disclosed herein. It is intended that the specification be considered exemplary only, with the scope and spirit of the invention being indicated by the claims.

In view of the above, it will be seen that the several advantages of the invention are achieved and other advantages attained.

As various changes could be made in the above methods and compositions without departing from the scope of the invention, it is intended that all matter contained in the above description and shown in the accompanying drawings shall be interpreted as illustrative and not in a limiting sense.

All references cited in this specification are hereby incorporated by reference. The discussion of the references herein is intended merely to summarize the assertions made by the authors and no admission is made that any reference constitutes prior art. Applicants reserve the right to challenge the accuracy and pertinence of the cited references.

REFERENCES

The following references are also incorporated by reference herein in their entirely: U.S. Pat. No. 6,544,315, title "Sintered Jewelry and Decorative Articles"; U.S. Pat. No. 6,553,667, titled "Apparatus and Method for Manufacturing Composite Articles Including Wear Resistant Jewelry and Medical and Industrial Devices and Composites Thereof"; U.S. Pat. No. 6,990,736, titled "Methods for Preparing Jewelry Articles Comprising Sintered Tungsten Carbide"; U.S. Pat. No. 6,993,842, titled "Methods and Jewelry Articles Comprising Sintered Tungsten Carbide"; U.S. Pat. No. 7,032,314, titled "Methods of Making Tungsten Carbide-Based Annular Jewelry Rings"; U.S. Pat. No. 7,076,972, titled "Tungsten Carbide-Based Annular Jewelry Article"; U.S. application Ser. No. 12/141,791, titled "Tungsten Ring Composition"; U.S. Pat. No. 7,761,996, titled "Methods of Making Tungsten Carbide-Based Annular Jewelry Rings"; U.S. Pat. No. 8,061,033, titled "Methods of Making Tungsten Carbide-Based Annular Jewelry Rings"; U.S. Pat. App. Ser. No. 61/492,197, filed Jun. 1, 2011; U.S. Pat. App. Ser. No. 61/493,249, filed Jun. 3, 2011; U.S. patent application Ser. No. 13/152,226, filed Jun. 2, 2011, titled "Multi-Coated Metallic Articles and Methods of Making Same"; Dobkin et al., "Principles of Chemical Vapor Deposition," Springer, New York (2003); and Mahan, "Physical Vapor Deposition of Thin Films," Wiley-Interscience, New York (2000).

What is claimed is:

1. A jewelry article or component of a jewelry article having a coating, consisting of:
   a jewelry article or a component of a jewelry article; and
   a coating deposited over the jewelry article or the component of the jewelry article, wherein the coating is selected from at least one of the following:
   titanium(2) nitride ($Ti_2N$), titanium-aluminum carbo-nitride (TiAlCN), chromium-titanium nitride (CrTiN), aluminum-titanium nitride (AlTiN), aluminum-titanium-chromium nitride (AlTiCrN), titanium-zirconium (TiZi), titanium-niobium-zirconium (TiNiZi), tungsten nitride (WN), titanium diboride (TiB2), tungsten carbide, cobalt, tungsten, titanium, zirconium, tantalum, rhodium, gold, silver, platinum, palladium, iridium, iron, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, silver nitride, aluminum nitride, tantalum nitride, chromium carbide, zirconium carbide, and cobalt chrome molybdenum.

2. The jewelry article or component of the jewelry article of claim 1, wherein the jewelry article or component of the jewelry article comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, zinc, tin, German silver, niobium, molybdenum, rhenium, hafnium, alloys of each of the foregoing and any combinations thereof.

3. The jewelry article or component of the jewelry article of claim 1, wherein the jewelry article or component of the jewelry article comprises tungsten carbide.

4. The jewelry article or component of the jewelry article of claim 1, wherein the coating exhibits electrical conductivity.

5. The jewelry article or component of the jewelry article of claim 1, wherein the coating is deposited onto the jewelry article or component of the jewelry article using electroplating, physical vapor deposition (PVD) or chemical vapor deposition (CVD).

6. The jewelry article or component of the jewelry article of claim 1, wherein the coating comprises cobalt-chromium.

7. The jewelry article or component of the jewelry article of claim 1, wherein the coating alters a luster of a metallic substance.

8. The jewelry article or component of the jewelry article of claim 7, wherein the luster is selected from color change, adamantine, dull, greasy, metallic, pearly, resinous, silky, submetallic, vitreous, waxy, asterism, aventurescence, chatoyancy, and schiller.

9. The jewelry article or component of the jewelry article of claim 1, wherein the coating comprises at least one of cobalt-chromium, cobalt, nickel, chromium and zirconium.

10. The jewelry article or component of the jewelry article of claim 1, wherein the coating further comprising titanium-aluminum nitride (TiAlN).

11. The jewelry article or component of the jewelry article of claim 1, wherein the coating further comprising chromium nitride (CrN).

12. The jewelry article or component of the jewelry article of claim 1, wherein the coating further comprising 316 stainless steel.

13. The jewelry article or component of the jewelry article of claim 1, wherein the coating further comprising 18-8 stainless steel.

14. The jewelry article or component of the jewelry article of claim 1, wherein the coating further comprising 304 stainless steel.

15. A jewelry article or component of the jewelry article consisting of a tungsten carbide substrate and a coating of cobalt-chromium.

16. The jewelry article or component of the jewelry article of claim 1, wherein the jewelry article or component of the jewelry article is a ring, an ornamental ring, an engagement ring, a toe ring, a watch, a bracelet, a necklace, a pendant, a charm, an armlet, a brocade, a pin, a clip, a hairclip, a fob, an ornamental piercing, an earring, a nose ring, a dog tag, an amulet, a bangle bracelet, a cuff bracelet, a link bracelet, a cuff link, a key chain, a money clip, a cell phone charm, a signet ring, a class ring, a friendship ring or a purity ring or a component of any of the foregoing.

17. A device consisting of:
   a substrate defining at least one of a jewelry article and a component of a jewelry article; and
   a coating deposited over the substrate, wherein the coating is selected from at least one of: titanium(2) nitride ($Ti_2N$), titanium-aluminum carbo-nitride (TiAlCN), chromium-titanium nitride (CrTiN), aluminum-titanium nitride (AlTiN), aluminum-titanium- chromium nitride (AlTiCrN), titanium-zirconium (TiZi), titanium-niobium-zirconium (TiNiZi), tungsten nitride (WN), titanium diboride (TiB2), tungsten carbide, cobalt, tungsten, titanium, zirconium, tantalum, rhodium, gold, silver, platinum, palladium, iridium, iron, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, silver nitride, aluminum nitride, tantalum nitride, chromium carbide, zirconium carbide, and cobalt chrome molybdenum.

18. The device of claim 17, wherein the substrate comprising at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, zinc, tin, German silver, niobium, molybdenum, rhenium, hafnium, an alloy of each of the foregoing and any combinations thereof.

19. The device of claim 17, wherein the substrate is a ring, an ornamental ring, an engagement ring, a toe ring, a watch, a bracelet, a necklace, a pendant, a charm, an armlet, a brocade, a pin, a clip, a hairclip, a fob, an ornamental piercing, an earring, a nose ring, a dog tag, an amulet, a bangle bracelet, a cuff bracelet, a link bracelet, a cuff link, a key chain, a money clip, a cell phone charm, a signet ring, a class ring, a friendship ring or a purity ring or a component of any of the foregoing.

20. The device of claim 17, wherein the coating further comprising at least one of titanium-aluminum nitride (TiAlN), chromium nitride (CrN), 316 stainless steel, 18-8 stainless steel, and 304 stainless steel.

21. A device consisting of:
a substrate defining at least one of a jewelry article and a component of a jewelry article, wherein the substrate comprising tungsten carbide; and
a coating deposited over the substrate, wherein the coating is selected from at least one of: titanium(2) nitride (Ti$_2$N), titanium-aluminum carbo-nitride (TiAlCN), chromium-titanium nitride (CrTiN), aluminum-titanium nitride (AlTiN), aluminum-titanium- chromium nitride (AlTiCrN), titanium-zirconium (TiZi), titanium-niobium-zirconium (TiNiZi), tungsten nitride (WN), titanium diboride (TiB2), tungsten carbide, cobalt, tungsten, titanium, zirconium, tantalum, rhodium, gold, silver, platinum, palladium, iridium, iron, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, silver nitride, aluminum nitride, tantalum nitride, chromium carbide, zirconium carbide, and cobalt chrome molybdenum.

22. The device of claim 21, wherein the substrate is a ring, an ornamental ring, an engagement ring, a toe ring, a watch, a bracelet, a necklace, a pendant, a charm, an armlet, a brocade, a pin, a clip, a hairclip, a fob, an ornamental piercing, an earring, a nose ring, a dog tag, an amulet, a bangle bracelet, a cuff bracelet, a link bracelet, a cuff link, a key chain, a money clip, a cell phone charm, a signet ring, a class ring, a friendship ring or a purity ring or a component of any of the foregoing.

* * * * *